United States Patent
Zhu et al.

(10) Patent No.: US 7,247,912 B2
(45) Date of Patent: Jul. 24, 2007

(54) STRUCTURES AND METHODS FOR MAKING STRAINED MOSFETS

(75) Inventors: Hiulong Zhu, Poughkeepsie, NY (US); Steven W. Bedell, Wappingers Falls, NY (US); Bruce B. Doris, Brewster, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 480 days.

(21) Appl. No.: 10/707,690

(22) Filed: Jan. 5, 2004

(65) Prior Publication Data

US 2005/0145954 A1  Jul. 7, 2005

(51) Int. Cl.
  *H01L 27/01* (2006.01)
(52) U.S. Cl. ................................. 257/353; 257/401
(58) Field of Classification Search ............. 257/192, 257/347, 353, 401, 619, 623, E21.422, E29.056, 257/E29.275, E29.298, E29.299
  See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |

(Continued)

FOREIGN PATENT DOCUMENTS

JP    64-76755    3/1989

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—David Vu
(74) *Attorney, Agent, or Firm*—Joseph P. Abate; Greenblum & Bernstein, P.L.C.

(57) ABSTRACT

A method and device providing a strained Si film with reduced defects is provided, where the strained Si film forms a fin vertically oriented on a surface of a non-conductive substrate. The strained Si film or fin may form a semiconductor channel having relatively small dimensions while also having few defects. The strained Si fin is formed by growing Si on the side of a relaxed SiGe block. A dielectric gate, such as, for example, an oxide, a high "k" material, or a combination of the two, may be formed on a surface of the strained Si film. Additionally, without substantially affecting the stress in the strained Si film, the relaxed SiGe block may be removed to allow a second gate oxide to be formed on the surface previously occupied by the relaxed SiGe block. Accordingly, a semiconductor device having a strained Si fin vertically oriented on a non-conductive substrate may be formed where the strained Si film is oriented such that it may form a channel of small dimensions allowing access to both sides and top in order to from single gate, double gate, or more gate MOSFETs and finFETs with a channel having a reduced number of defects and/or reduced dimensions.

8 Claims, 10 Drawing Sheets

U.S. PATENT DOCUMENTS

| | | | |
|---|---|---|---|
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,981,356 | A | 11/1999 | Hsueh et al. |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,080,637 | A | 6/2000 | Huang et al. |
| 6,090,684 | A | 7/2000 | Ishitsuka et al. |
| 6,093,621 | A | 7/2000 | Tseng |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,583,060 | B2 | 6/2003 | Trivedi |
| 6,717,216 | B1 | 4/2004 | Doris et al. |
| 6,800,910 | B2 * | 10/2004 | Lin et al. ............ 257/410 |
| 6,815,738 | B2 * | 11/2004 | Rim ............ 257/256 |
| 6,825,529 | B2 | 11/2004 | Chidambarrao et al. |
| 6,831,292 | B2 | 12/2004 | Currie et al. |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0082634 | A1 | 4/2005 | Doris et al. |
| 2005/0093030 | A1 | 5/2005 | Doris et al. |
| 2005/0098829 | A1 | 5/2005 | Doris et al. |
| 2005/0106799 | A1 | 5/2005 | Doris et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0236668 | A1 | 10/2005 | Zhu et al. |
| 2005/0245017 | A1 | 11/2005 | Belyansky et al. |
| 2005/0280051 | A1 | 12/2005 | Chidambarrao et al. |
| 2005/0282325 | A1 | 12/2005 | Belyansky et al. |
| 2006/0027868 | A1 | 2/2006 | Doris et al. |
| 2006/0057787 | A1 | 3/2006 | Doris et al. |
| 2006/0060925 | A1 | 3/2006 | Doris et al. |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15, 2002.

Z. Yang, et al., "Avalanche Current Induced Hot Carrier Degradation in 200 GHz SiGe Heterojunction Bipolar Transistors." pp. 1-5, 2002.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx Sl 1-x/Si Strained-Layer Superlattice Grown by Molecular Beam Epitaxy". J. Vac. Sci. Technol. A 2(2). Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel/Si/SiGe pMOSFET with Enhanced Device Performance and Scalability". 2000, IEEE, pp. 151-154.

* cited by examiner

STRUCTURES AND METHODS FOR MAKING STRAINED MOSFETS

BACKGROUND OF INVENTION

The invention generally relates to making MOSFETs with vertical gates of strained Si, and more particularly relates to making single gate and double gate MOSFETS and finFETS with vertical gates of strained Si.

As semiconductor devices shrink, traditional device fabrication techniques have approached practical limits in size scaling. For example, as channel lengths shrink below about 50 nm, devices start to exhibit short channel effects including threshold voltage rolling off for shortened channel lengths. Unwanted short channel effects may be reduced by higher doping concentrations, which lead to the unwanted effects of carrier mobility degradation, increased parasitic junction capacitance, and increased sub-threshold swing if doping concentrations become too high.

One method to minimize short channel and reverse short channel effects includes striking an optimum doping profile by well controlled implantation and annealing. However, carefully controlling implantation and annealing adds costs to the fabrication process, and are ultimately limited in effectiveness as channel lengths are further reduced. Scaling limits imposed due to the limitation of gate oxide thickness and source/drain junction depth may also arise to impair function of the smaller devices.

Another method to achieve further reduced scale includes difficult to manufacture profiles for the channel. Such profiles include double gate, triple gate, quadruple gate, omega-gate, pi-gate, and finFET MOSFET designs. Some of these designs are plagued with design problems such as gate alignment errors leading to increased parasitic capacitance.

Another possible way to avoid some scaling problems is to improve device performance by improving material performance. For example, strained Si produces higher mobility of carriers resulting in faster and/or lower power consumption devices. Due to changes in strained Si crystalline structure (i.e. its symmetry and lattice constant are different due to its strain state), a strained Si film has electronic properties that are superior to those of bulk Si. Specifically, the strained Si could have greater electron and hole mobilities, which translate into greater drive current capabilities for n-type and p-type transistors, respectively. Accordingly, devices incorporating strained Si may have improved performance without necessarily reducing device size. However, where the strained Si does allow for further scaling, performance improvement will be further improved.

It should be noted, however, an important criteria in enabling high-performance devices by utilizing strained Si is the fabrication of a low-defect-density strained Si film. In particular, reducing the number of dislocations in the strained Si film is especially important in order to reduce leakage and improve carrier mobility.

Growing a Si layer on a substrate having lattice parameters different from the Si, generates the strained Si film. Accordingly, the number of defects in the strained Si film may be proportional to the number of defects in the underlying substrate on which the film is grown. An increase in the number of dislocations in the Si channel can increase the leakage current in the device while in the "off" stage. When formed improperly, the strained Si film can contain a high number of defects and the subsequent strained Si film will then exhibit poor performance characteristics, and any benefits of using a strained Si film will be substantially negated.

Accordingly, producing strained Si films having minimal defects such as dislocations is desirable for further reduction in semiconductor device size and power requirements. Thin strained Si films having few defects may lead to improved semiconductor device performance

SUMMARY OF INVENTION

In one aspect of the invention, a method comprises forming a relaxed SiGe block on a substrate and forming a strained Si film on the substrate adjacent at least one side of the relaxed SiGe block. The method further includes forming a gate oxide on a side of the strained Si film to form a strained channel region.

In another aspect, the invention includes a method comprising forming a relaxed SiGe block on an oxide substrate and forming a first nitride spacer on a top of the relaxed SiGe block. A second nitride spacer is formed on the oxide substrate adjacent a first side of the relaxed SiGe block and a side of the first nitride spacer, and a strained Si film is epitaxially formed on a second side of the relaxed SiGe block.

In still another aspect, the invention includes a channel for a semiconductor device comprising a fin of strained Si vertically oriented on a non-conductive substrate.

DETAILED DESCRIPTION

The invention relates to forming MOSFETs with channels of strained Si. In the invention, transistor performance is enhanced by creating thin films of strained Si. Due to the small dimension of the strained Si, when it is formed, such as by epitaxial growth techniques, the defect density (i.e. dislocation) is typically very low. Such a low defect film may be produced by forming a vertical SiGe bar or block on a relaxed SiGe-on-oxide wafer. One side of the SiGe bar or block may be covered with nitride. The other side of the vertical SiGe bar or block may be covered with a small dimensioned Si film using a selective eptiaxial growth process. The Si film will be strained due to mismatch of the lattice constants with the SiGe substrate. Due to the small dimensions of the Si film and the relaxed structure of the SiGe substrate, the tendency for dislocation formation is reduced. After completion, the strained Si can be subjected to further processing to build various types of MOSFETS such as finFETs with single, double, or more gates.

Figure 1:
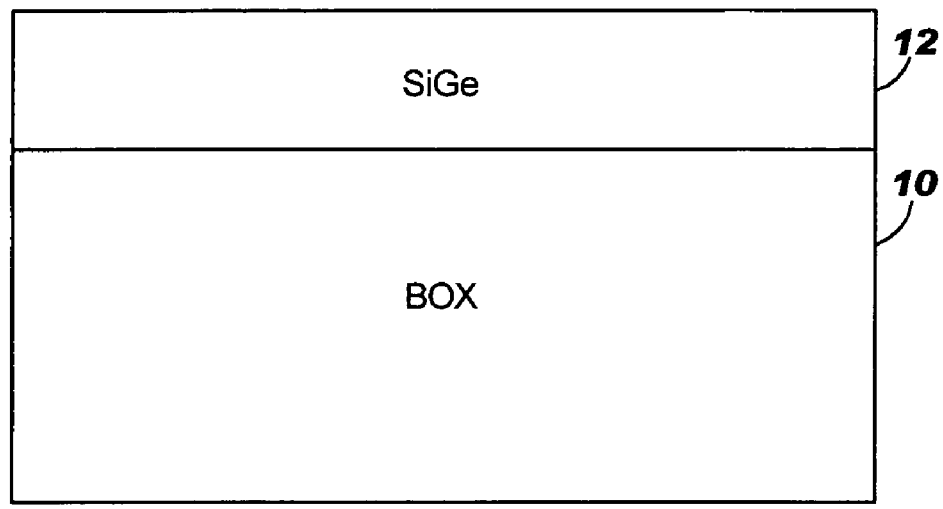
FIGS. 1–8 illustrate steps in forming an embodiment in accordance with the invention.

FIG. 1 illustrates a relaxed SiGe layer 12 on an oxide wafer 10. Although an oxide wafer is used in this example, any non-conductive substrate suitable for semiconductor device fabrication may be used. The relaxed SiGe layer 12 may be formed on the oxide wafer 10 by any of the suitable methods known in the art such as wafer binding or oxygen implantation annealing. In one embodiment, the SiGe layer 12 may range between 30 nm and 80 nm in thickness, although other thicknesses are contemplated by the invention.

Figure 2:
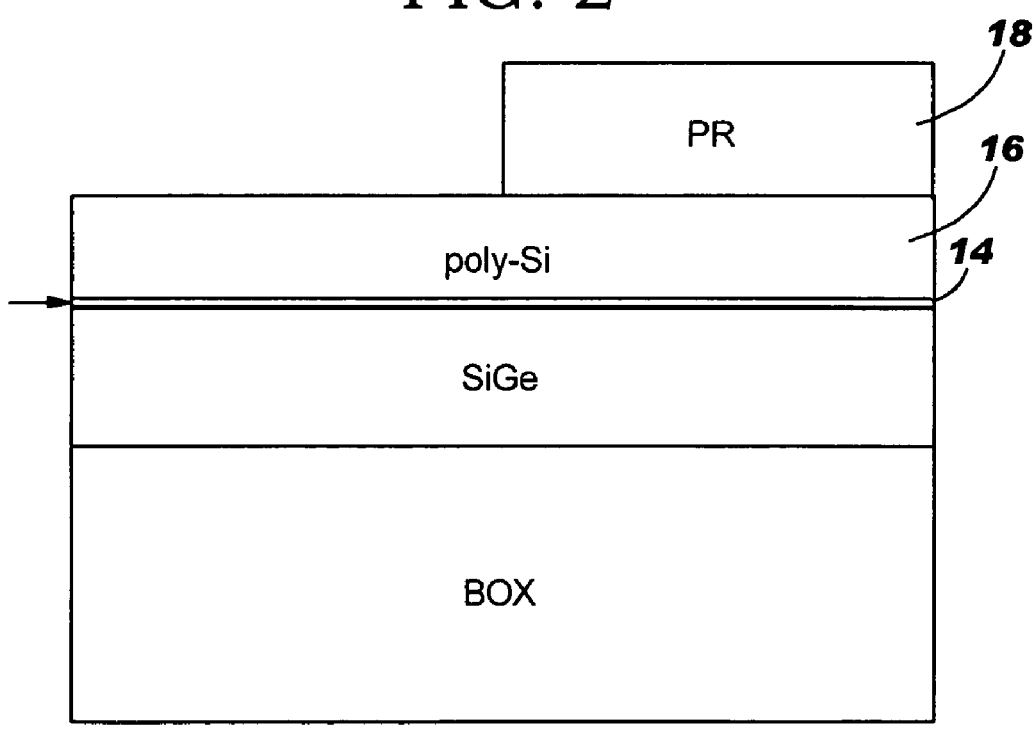

FIG. 2 shows a thin oxide layer 14 deposited over the relaxed SiGe layer 12. A first polysilicon layer 16 is formed on the oxide layer 14. Next, a photoresist 18 is deposited on the first polysilicon layer 16 and patterned so a portion of the first polysilicon layer 16 is covered by the photoresist 18 and a portion of the first polysilicon layer 16 is exposed. Typical thicknesses for the thin oxide layer 14 range from about 5 nm to 20 nm, and 40 nm to 100 nm for the first polysilicon layer 16. Each layer is formed by methods which are well known in the art.

Figure 3:
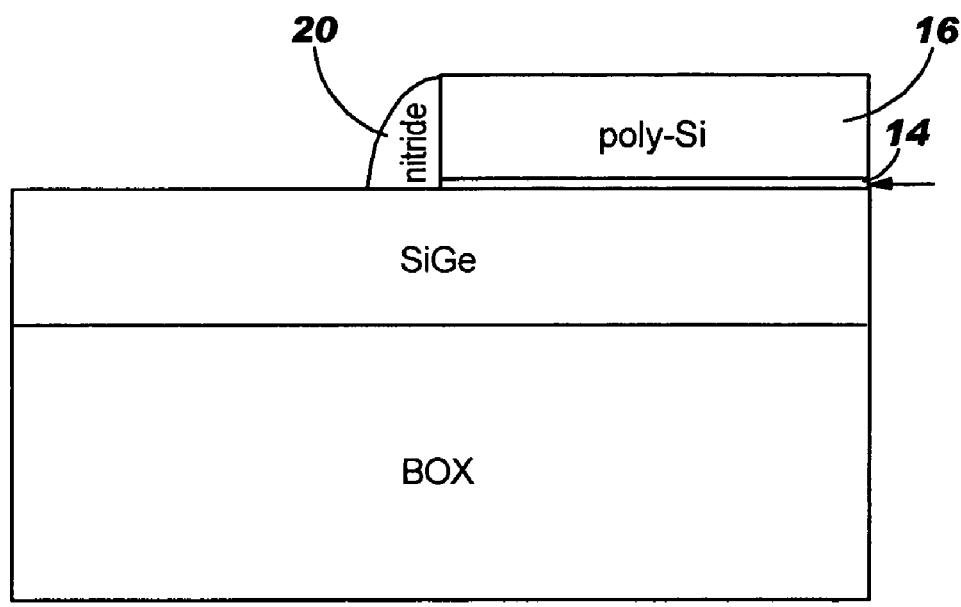

FIG. 3 illustrates the results of an etching process where the exposed portion of the first polysilicon layer 16 and underlying thin oxide layer 14 are etched away leaving a portion of the first polysilicon 16. The etching process uses known methods to selectively etch polysilicon and oxide. The photoresist layer 18 has also been removed after etching the first polysilicon 16 and oxide layer 14. Accordingly, a first portion of the SiGe layer 12 lies exposed and a second portion of the SiGe layer 12 is covered with the thin oxide layer 14 and first polysilicon layer 16. Next, a first nitride spacer 20 is formed on top of the SiGe layer 12 abutting the edge of the thin oxide layer 14 and first polysilicon layer 16 using any of the nitride forming processes well known in the art.

Figure 4:
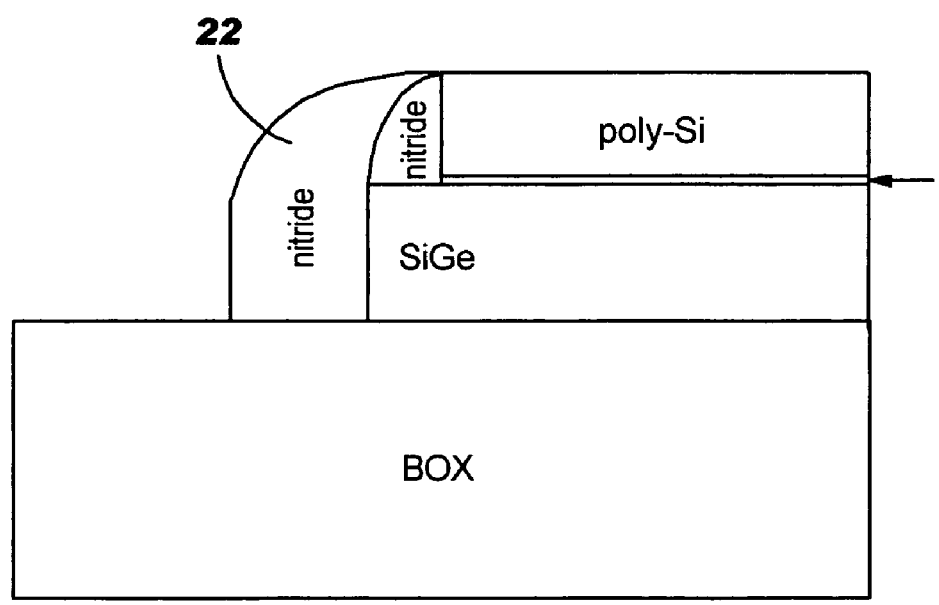

FIG. 4 shows a further etching step in which the exposed SiGe layer 12 is selectively etched using an etching process similar to those described with reference to FIG. 3. In FIG. 4, the portion of the relaxed SiGe layer 12 not covered by the first nitride spacer 20, and the thin oxide layer 14 and first polysilicon layer 16, is etched away to expose a portion of the underlying oxide wafer 10. A second nitride spacer 22 is then formed on the exposed portion of the oxide wafer 10, abutting the edges of the etched relaxed SiGe layer 12. The first nitride spacer 20 lies adjacent to a second larger nitride spacer 22.

Figure 5:
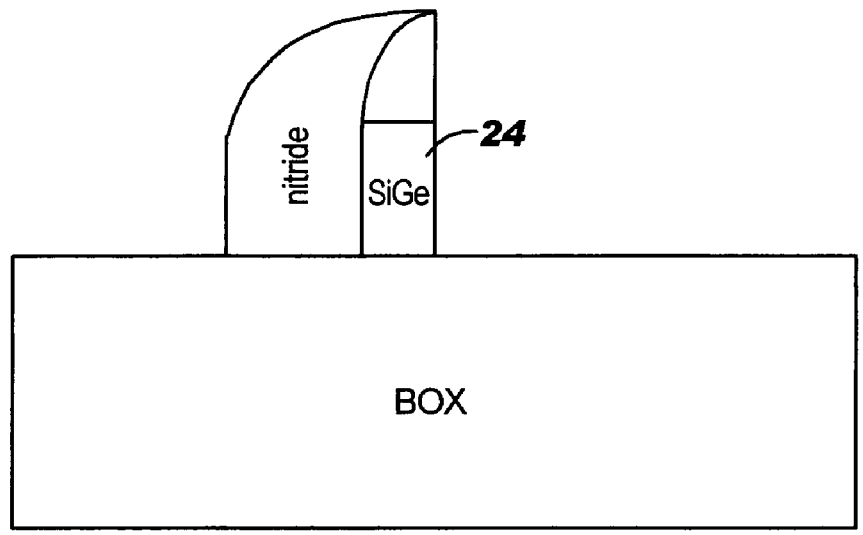

FIG. 5 illustrates the results of selectively etching the remaining portions of the first polysilicon layer 16 and thin oxide layer 14. The portion of the relaxed SiGe layer 12 underlying the thin oxide layer 14 and first polysilicon layer 16 is etched away in this process. Consequently, the relaxed SiGe shaped as a SiGe block 24 remains from the original relaxed SiGe layer 12 on top of the oxide wafer 10. The SiGe block 24 is surrounded on one side by the second nitride layer 22 and on the top by the first nitride spacer 20, leaving one side of the SiGe block 24 exposed.

Figure 6:
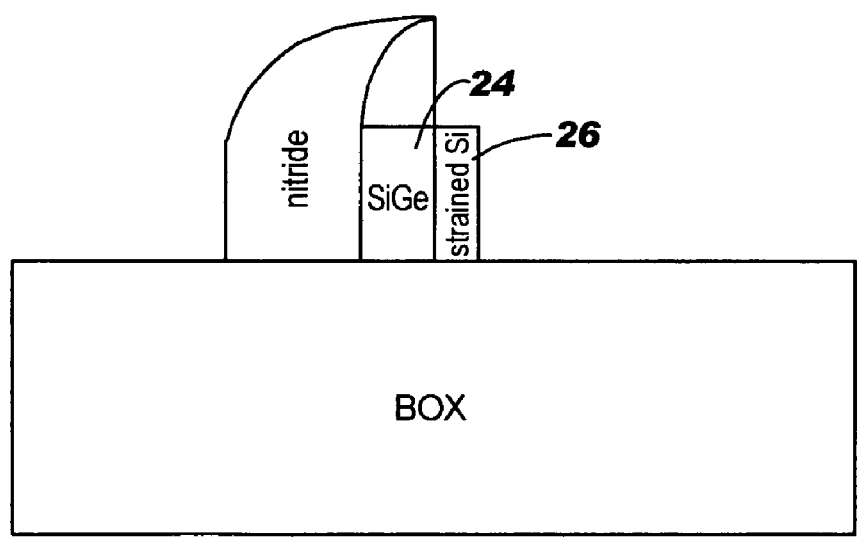

FIG. 6 illustrates a "strained" Si film 26 epitaxially grown on the exposed side of the SiGe block 24. A selective growing process is used so that the Si film 26 is formed only on the exposed portion of the SiGe block 24. In this process, the Si film 26 has a height greater than its thickness and is vertically oriented on the surface of the oxide wafer 10. Because the Si film 26 may be formed with substantially any aspect ratio (height divided by thickness) including those greater than 1, the Si film 26 may be characterized as a "fin" vertically oriented on the oxide wafer 10.

Additionally, the Si film 26 may be approximately the same height as the SiGe block 24. Accordingly, the height of the Si film 26 may be controlled by adjusting the height of the layer of the relaxed SiGe layer 12. The height of the SiGe layer 12 may be controlled during its formation by methods well known in the art. Furthermore, the thickness of the Si film 26 may be controlled during the growing process by suitable methods well know in the art of device fabrication. The Si film 26 may range from about 50 Å (Angstroms) to about 200 Å in thickness, although other thicknesses may be used where needed.

The Si film 26 may be used as the channel in a semiconductor device in virtually any type of device benefiting from a channel having a reduced number of defects and/or having small dimensions. Accordingly, at least one gate oxide may be formed on a portion of the Si channel with source/drain regions formed in the Si film 26 on either side of the gate oxide. The resulting structure, because it is vertically oriented, allows access to both sides and a top of the channel from above the substrate. This geometry allows the gate oxide to surround the channel, and allow for almost total depletion of the channel to be achieved in the off state. It also allows both sides of the source/drain regions to be accessed for better doping and better lead connectivity.

By growing the Si film 26 on a surface of the relaxed SiGe block 24, the number of defects such as dislocations in the resulting Si film 26 are reduced. Dislocations in the Si film 26 are also minimized because only a thin film of small size is grown. Additionally, the strained Si film acquires its internal strain due to its crystal lattice being formed on the SiGe crystal lattice. That is, the SiGe block 24 has a crystal lattice constant (different dimensions between the atoms) than that of the Si film, i.e., standing alone, Si would normally have a smaller lattice constant than the SiGe because the lattice constant of the Si material does not match the lattice constant of the SiGe. However, in the structure of the invention, the lattice structure of the Si layer will tend to match the lattice structure of the SiGe. By virtue of the lattice matching of the Si (which normally is smaller) to the SiGe mask, the Si layer is placed under a tensile stress. That is, the SiGe mask will try to obtain an equilibrium state thus resulting in a stress of an Si sidewall layer formed on the SiGe. This volume of stressed Si may act as a strained channel. Accordingly, the Si film 26 may be described as a low defect strained Si fin or channel.

Figure 7:
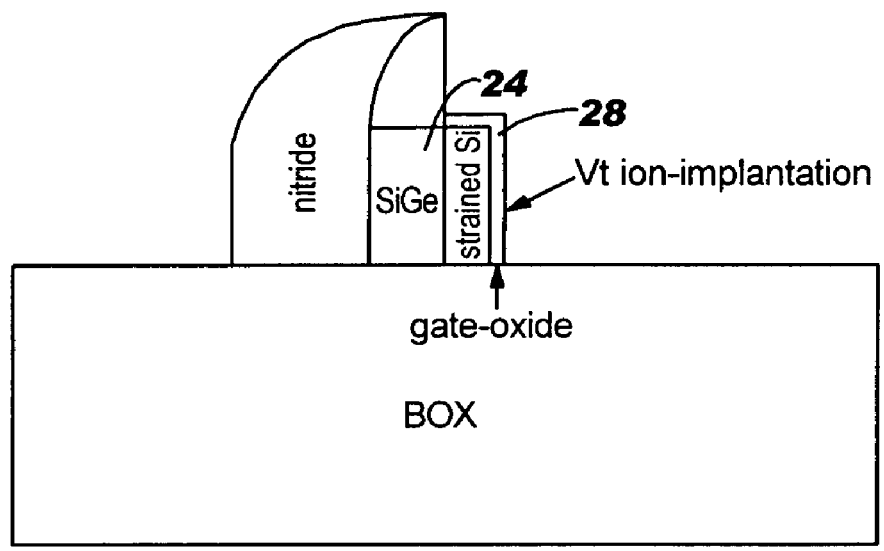

FIG. 7 shows the formation of a gate oxide 28 using ion implantation on the exposed side of the Si film 26. $V_t$ (threshold voltage) ion implantation techniques may be used, for example, and the implantation angle may be tilted towards gate oxide 28 on the side. Examples of gate oxide 28 thicknesses range from about 9 Å to about 20 Å, although other thicknesses may be formed when required. It is also possible to use high "k" materials, such as $HfO_2$, to replace the oxide as a gate dielectric.

Figure 8:
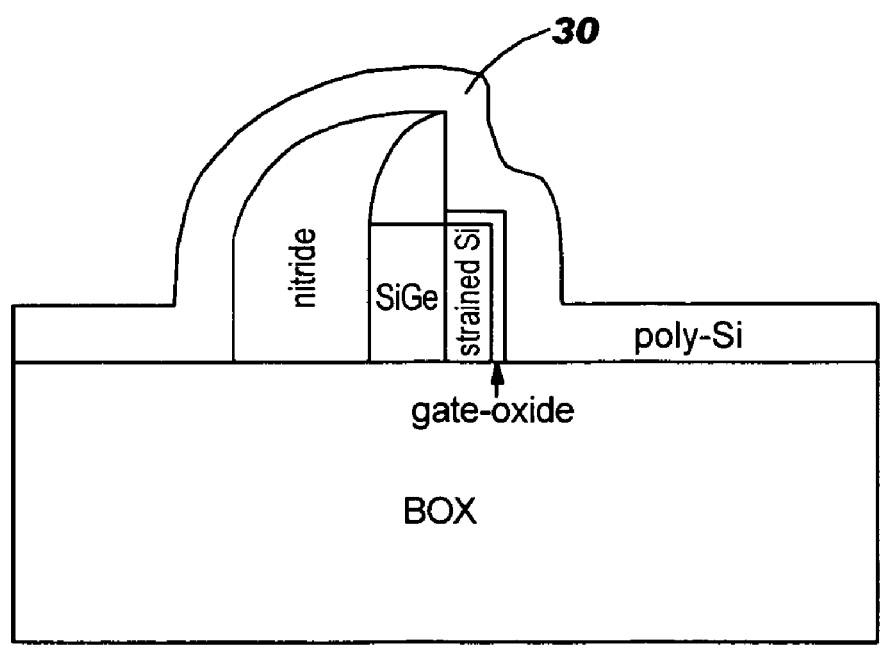

FIG. 8 shows a second polysilicon layer 30 deposited over the first and second nitride spacers, 20 and 22, SiGe block 24, Si film 26 and gate oxide 28. Although the second polysilicon layer 30 is shown as a conformal layer, a non-conformal layer, or a layer with a topography somewhere between conformal and non-conformal may be formed as required for subsequent steps of device formation. As an example, the polysilicon layer 30 may range from a thickness of about 700 Å to about 1500 Å.

From the configuration illustrated in FIG. 8, various devices may be fabricated including, for example, strained Si MOSFETs such as, for example, a finFET with a single strained gate or a finFET with a strained double gate. FIGS. 9–14 show an example of fabricating a single-gate device, and FIGS. 15–19 show an example of fabricating a double-gate finFET type device. Additionally, a tri-gate device, with the gte dielectric wrapping around the top and two sides of the strained Si film may also be fabricated from the structure shown in FIG. 8. Although examples of a single-gate device and double-gate finFET type device are shown, any type of device which may benefit from a vertical strained Si film with reduced dislocations may be fabricated from the illustrated structure shown in FIG. 8.

Figure 9:
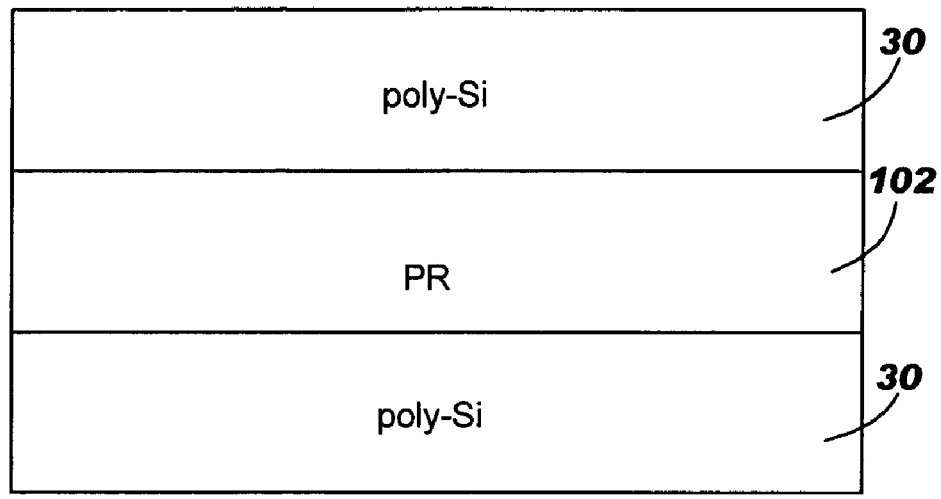
FIGS. 9–14 illustrate steps in forming devices in accordance with the invention.
Figure 10:
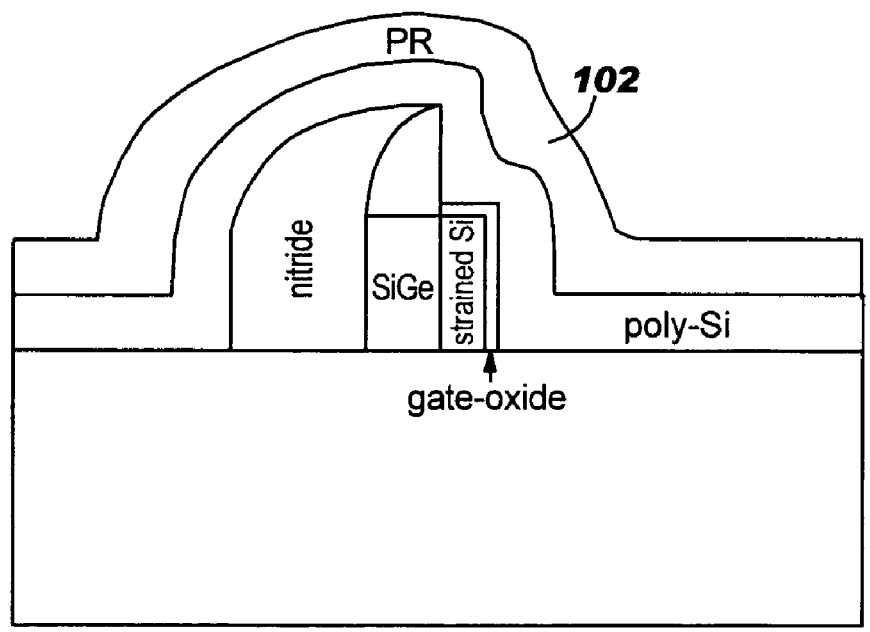

Referring to FIG. 9, a top view of the device being fabricated is illustrated with a photoresist 102 deposited and patterned over the second polysilicon layer 30. As shown in FIG. 9, the photoresist 102 is deposited over the second polysilicon layer 30 in the region of the Si film 26 which will form the gate of the resulting device. FIG. 10 illustrates a side view of the structure of FIG. 9 with the photoresist 102 over the second polysilicon layer 30.

Figure 11:
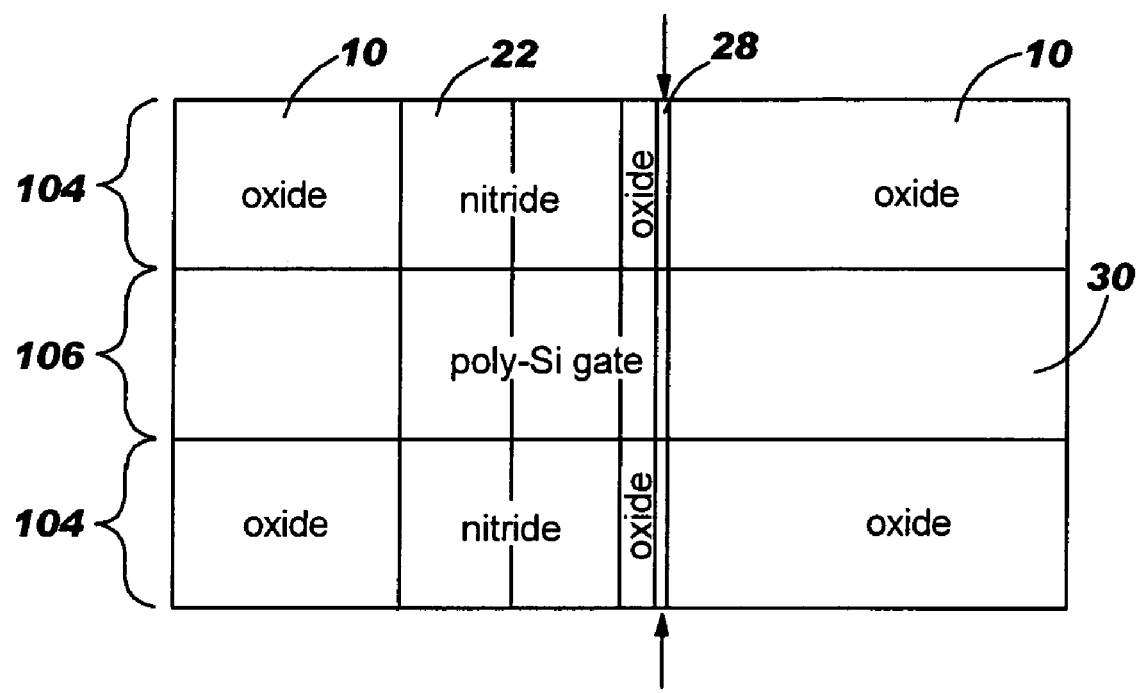

FIG. 11 illustrates a top view of the resulting structure after etching the photoresist 102 of FIG. 9 using etching processes known in the art such as wet etching. In particular, the etching step leaves what will become two source/drain regions 104, one on either side of a gate region 106. In the source/drain regions 104, the oxide wafer 10, gate oxide 28 on the side and top of the underlying Si film 26, and second nitride spacer 22 are exposed. The Si film 26 is not visible in FIG. 11.

Figure 12:
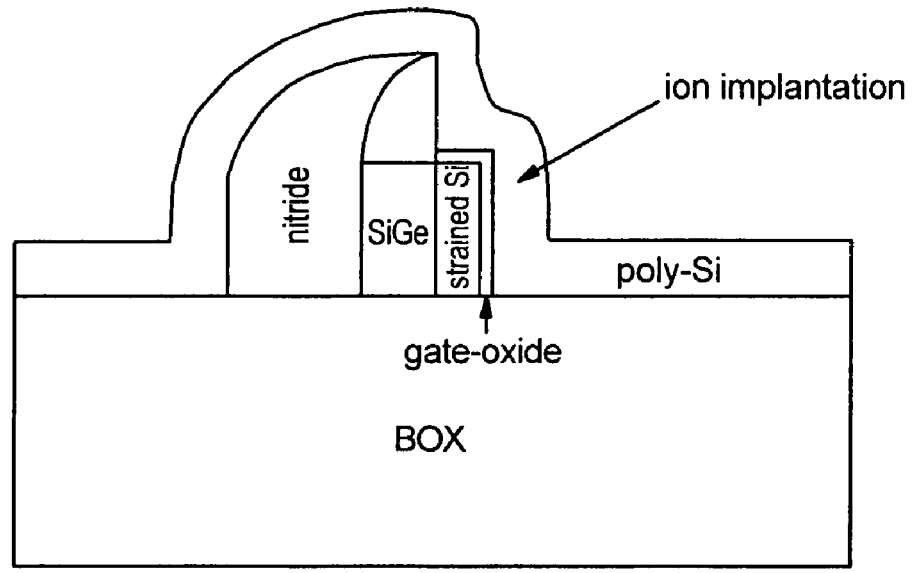

FIG. 12 illustrates a cross section of the device shown in FIG. 11. As illustrated in FIG. 12, an ion implantation is performed in the source/drain regions 104 to form extensions on either side of the gate region 106. Any ion implantation process appropriate for source/drain implantation for the device being fabricated may be used as is well known in the art. Large tilt angle ion implantation, with energy levels of, for example, of about 0.21 keV for boron implantation or 12 keV for arsenic, may additionally be used.

Figure 13:
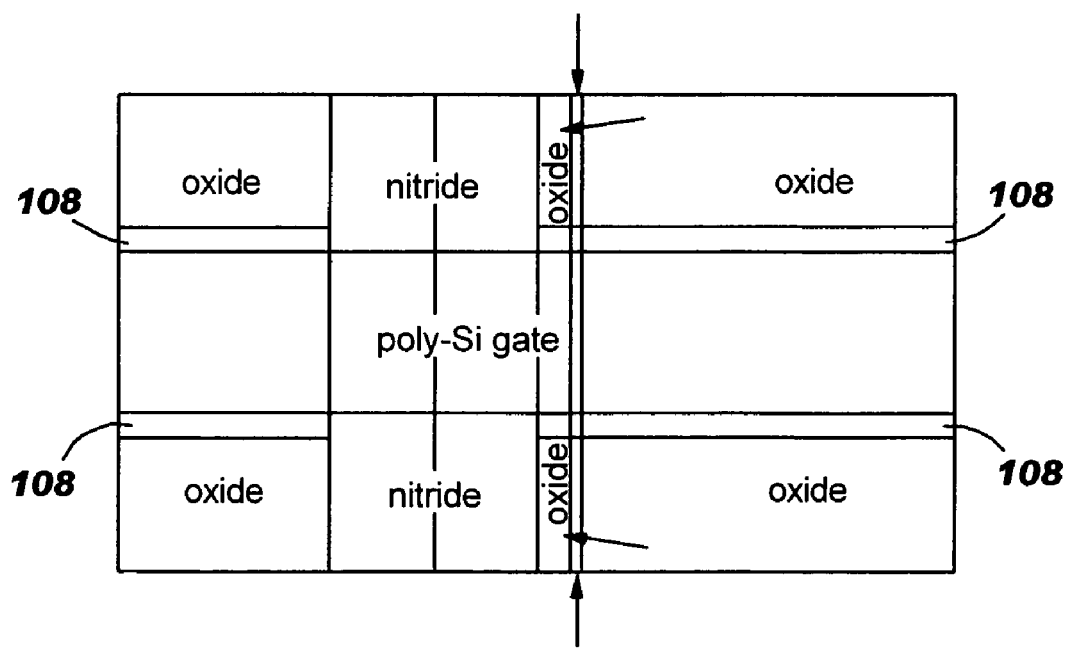
Figure 14:
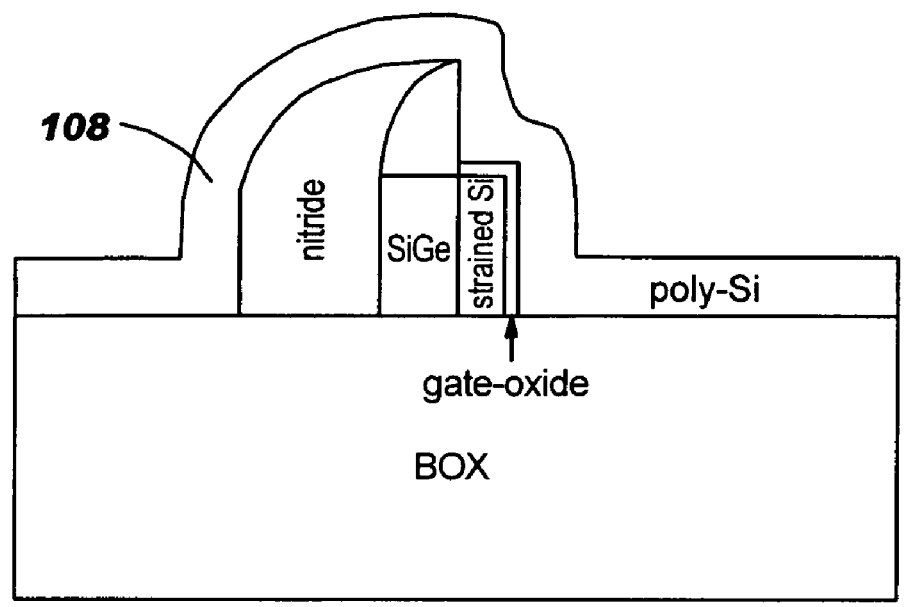

FIG. 13 illustrates a top view of the device being fabricated after nitride spacers 108 are formed by nitride deposition onto the oxide wafer 10 adjacent the second polysilicon layer 30, and subsequent etching. FIG. 14 illustrates the nitride spacers 108 overlaying the gate oxide 28 and second nitride spacer 22. After forming the nitride spacers 108, further processing steps including source/drain implantation and annealing may be carried out, as appropriate for the device being fabricated.

Figure 15:
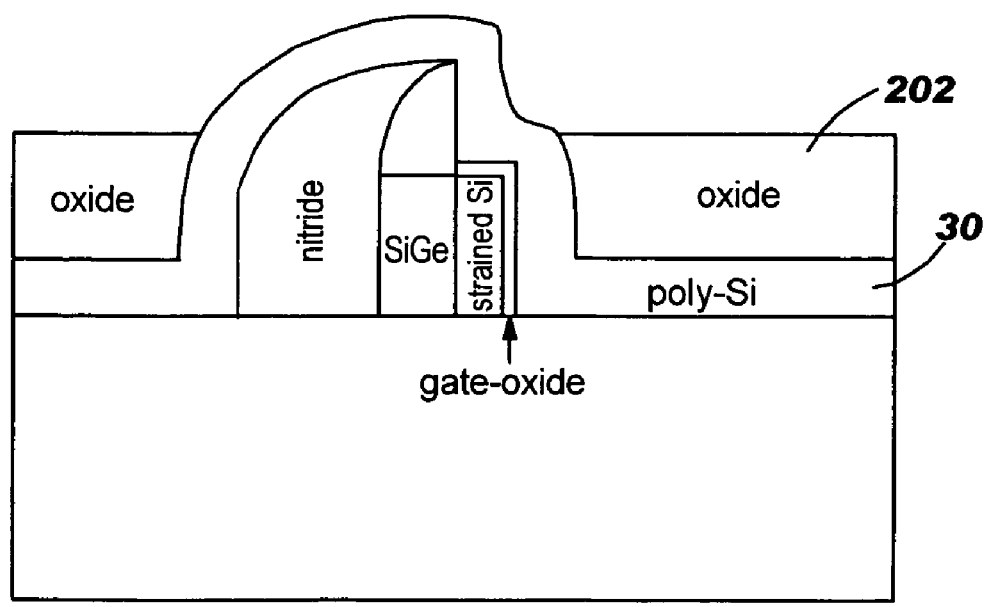
FIGS. 15–19 illustrate further steps in forming an embodiment in accordance with the invention.

Starting with the structure shown in FIG. 8, FIG. 15 illustrates a subsequent step in the formation of a strained Si double gate finFET, which is an example of another type of device in which the strained Si film included in the invention may be implemented. As shown in FIG. 15, an oxide film 202 is deposited, and planarized using, for example, CMP (chemical mechanical planarizing). The remaining oxide film 202 is then etched leaving a portion of the second polysilicon layer 30 exposed above the oxide film 202. The oxide film 202 may be deposited using, for example, directional HDP (high density plasma) to preferentially deposit most of the oxide on the flat surfaces and less oxide on the top of the polysilicon 30 in the region above the nitride spacers, 20 and 22.

Figure 16:
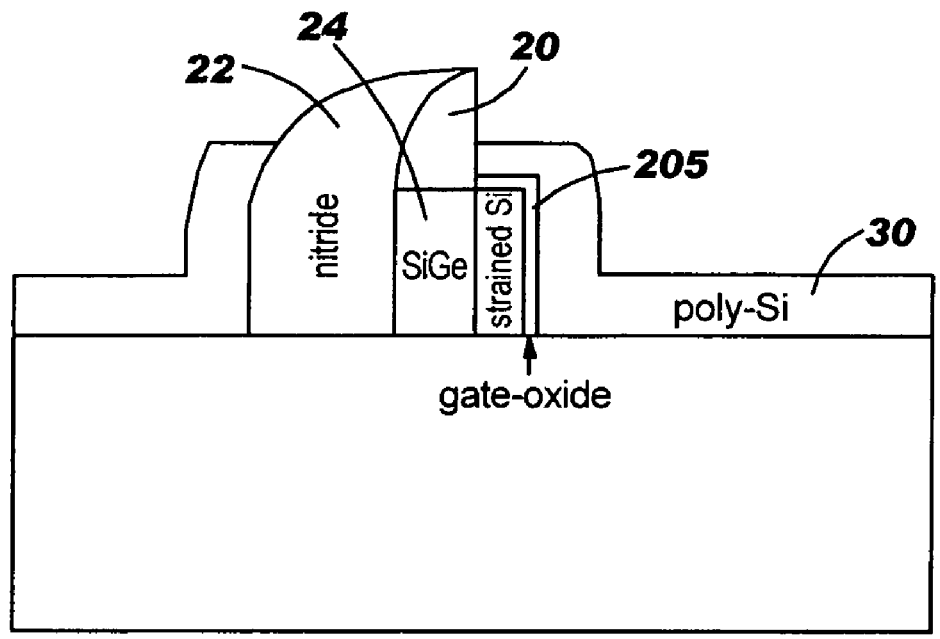

FIG. 16 illustrates etching a portion of the second polysilicon layer 30 to leave a portion of the first and second nitride layers, 20 and 22, exposed. Suitable etching processes may include any process to selectively etch polysilicon and any etching process, such as a wet etch, to selectively etch the oxide. After etching, the first and second nitride spacers, 20 and 22, are exposed and protrude above the second polysilicon layer 30. The second polysilicon layer 30 will form a raised region in the vicinity of the bases of the first and second nitride spacers, 20 and 22, and gate oxide 28.

Figure 17:
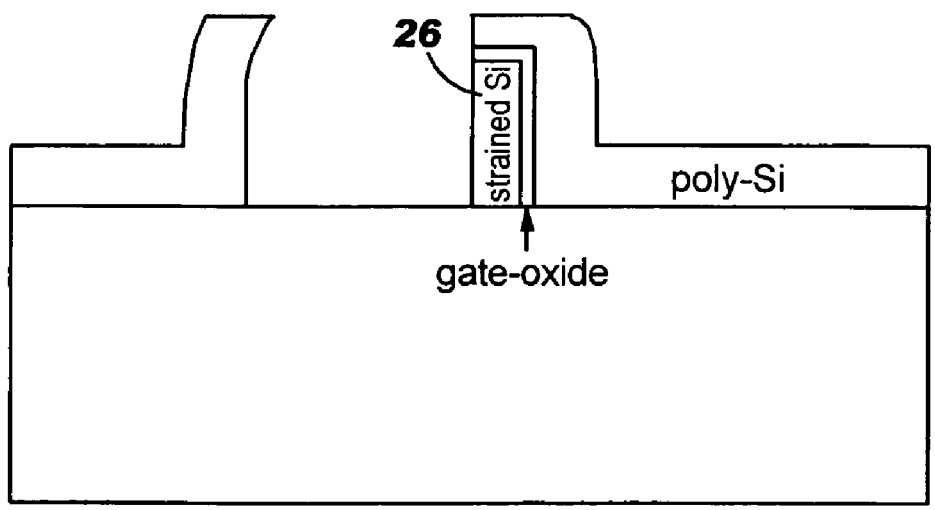

FIG. 17 illustrates the results of wet selective etching of the two nitride spacers, 20 and 22 a wet etching of the SiGe block 24. Throughout the fabrication process, typical etchants which may be used to etch nitride include, for example, fluorine and chlorine. Selective etching of $Si_3N_4$ to $SiO_2$ may be performed with a boiling $H_3PO_4$ solution (e.g., 85% $H_3PO_4$ at 180° C.) because this solution attacks $SiO_2$ very slowly. The etch rate is ~10 nm/min for $Si_3N_4$, but less than 1 nm/min for $SiO_2$. $Si_3N_4$ is etchable at room temperature in concentrated HF or buffered HF. However, HF also etches $SiO_2$. Using a reactive ion plasma etching process, the following etch chemistries may be used for $Si_3N_4$: $CHF_3/O_2$; $CH_2F_2$; $CH_2CHF_2$. By removing the SiGe block 24 and the first and second nitride spacers, 20 and 22, the strained Si 26 film has a side exposed for further processing, such as, for example, adding another gate oxide.

Figure 18:
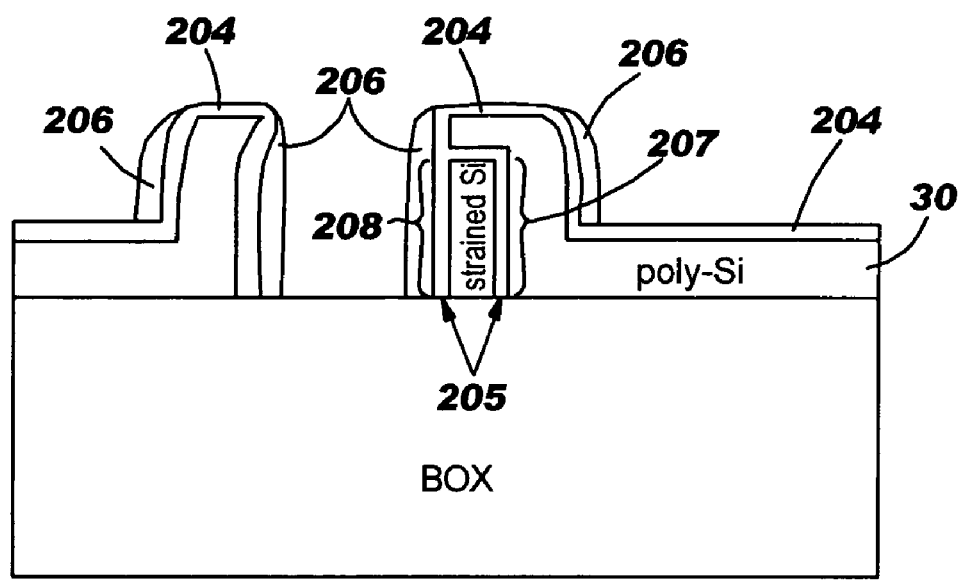

FIG. 18 illustrates forming a second gate oxide 208 by a gate oxidation process which forms a thin oxide layer 204 and 205 over the exposed portions of the device and Si film 26, respectively. In particular, the portion of the thin oxide layer 205 formed over the Si film 26 constitutes a second gate oxide 208 portion of the gate oxide 205. The gate oxide 205 also includes the first gate oxide 207 formed in an earlier step. The second gate oxide 208 may be formed by, for example, a thermal oxide growing process to produce a high quality oxide.

Also shown in FIG. 18 is a thin polysilicon layer deposited over the surface of the device. The structure is then subjected to a direct etch to form thin polysilicon spacers 206 on the sides of the thin oxide layer 204. In particular, a thin polysilicon spacer 206 is formed adjacent the second gate oxide 208. The polysilicon spacers 206 may protect the gate oxide 208 from further etching processes. The thin polysilicon spacers 206 may be, for example, about 100 Å thick. Additionally, the thin polysilicon spacers 206 are formed to leave portions of the thin oxide layer 204 exposed on the top portions of the second polysilicon layer 30.

Figure 19:
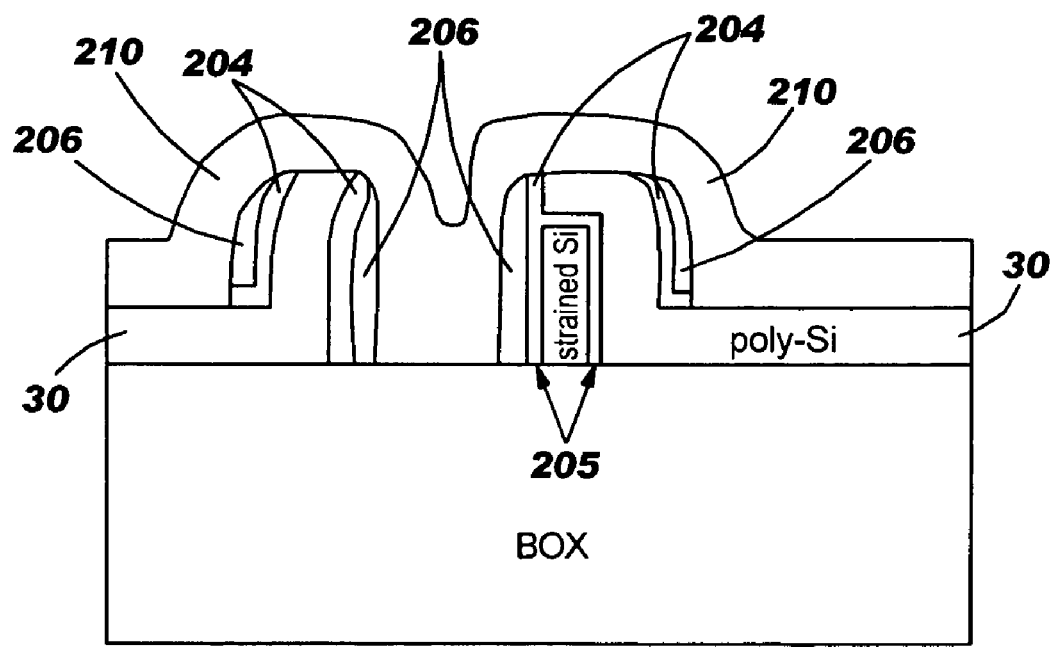

FIG. 19 illustrates etching the exposed portions of the thin oxide layer 204. Any process which selectively etches an oxide layer may be used to remove the exposed portions of the thin oxide layer 204. After the oxide etching is completed, polysilicon is deposited to form a third polysilicon layer 210 over the substrate. The resulting structure includes a fin of strained Si 26 standing vertical to the oxide wafer 10 surrounded on its sides and top by a gate oxide 205. Both of the sides of the vertical fin of strained Si 26 are accessible from above the surface of the oxide wafer 10. Furthermore, the vertical fin of strained Si 26 also includes source/drain regions with both of their sides and top accessible from above the oxide wafer 10.

It is possible to continue processing the device illustrated in FIG. 19 to produce a completed double-gate finFET device having a strained Si film with fabrication steps well known in the art.

While the invention has been described in terms of embodiments, those skilled in the art will recognize that the invention can be practiced with modification within the spirit and scope of the appended claims. For example, the invention can be readily applicable to bulk substrates.

The invention claimed is:

1. A semiconductor structure, comprising:
   a channel having a fin of strained Si vertically oriented on a non-conductive substrate;
   a gate comprising at least one of an oxide and a high k material formed on a first side, a second side and a top of the strained Si film;
   a poly silicon layer adjacent the at least one of an oxide and a high k material formed on the first side, the second side and the top of the strained Si film; and
   an oxide layer partially formed on the poly silicon layer.

2. The structure of claim 1, wherein the strained Si film is between about 50 Å and 200 Å thick.

3. The structure of claim 1, wherein the strained Si film is epitaxially grown on a block of relaxed SiGe, wherein the relaxed SiGe comprises a range of Ge ranging from about 0% to about 100%.

4. The structure of claim 1, wherein the Si film is a low defect strained Si film.

5. The structure of claim 1, further comprising a second poly silicon layer over the oxide layer and the poly silicon layer.

6. The structure of claim 1, wherein the oxide layer is formed substantially in a vertical orientation.

7. The structure of claim 1, wherein the oxide layer is formed on a side wall of the fin.

8. A semiconductor structure, comprising:
- strained Si vertically oriented fin on a non-conductive substrate;
- an oxide layer surrounding the Si vertically oriented fin;
- a polysilicon layer covering the oxide material surrounding the Si vertically oriented fin; and
- an oxide layer partially formed on the poly silicon layer;
- polysilicon spacer on the oxide layer; and
- a third polysilicon layer formed over the polysilicon spacers and the polysilicon layer.

* * * * *